United States Patent [19]

Moussavi et al.

[11] Patent Number: 5,504,429
[45] Date of Patent: Apr. 2, 1996

[54] PROBE FOR DETECTING AND DOSING MOLECULAR OXYGEN BY MEANS OF ELECTRONIC PARAMAGNETIC RESONANCE SPECTROMETRY

[75] Inventors: Mehdi Moussavi, St Egreve; Marc Beranger, Meylan, both of France

[73] Assignee: Commissariat a l'Energie Atomique, Paris, France

[21] Appl. No.: 114,837

[22] Filed: Sep. 2, 1993

[30] Foreign Application Priority Data

Sep. 21, 1992 [FR] France .................................. 92 11203

[51] Int. Cl.$^6$ .................................................. G01V 3/00
[52] U.S. Cl. ........................................... 324/300; 324/316
[58] Field of Search ................................. 324/300, 301, 324/316, 317, 318, 322

[56] References Cited

U.S. PATENT DOCUMENTS

| | | | |
|---|---|---|---|
| 4,593,248 | 6/1986 | Hyde et al. ............................. | 324/317 |
| 4,803,624 | 2/1989 | Pilbrow et al. ........................ | 324/300 |
| 5,112,597 | 5/1992 | Moussavi ............................... | 424/9 |
| 5,159,269 | 10/1992 | Moussavi et al. ..................... | 324/301 |
| 5,258,313 | 11/1993 | Moussavi ............................... | 436/136 |
| 5,313,162 | 5/1994 | De Graaf et al. ..................... | 324/300 |
| 5,347,219 | 9/1994 | Gentsch et al. ....................... | 324/300 |

FOREIGN PATENT DOCUMENTS

| | | |
|---|---|---|
| 0467748 | 1/1992 | European Pat. Off. . |
| 0589756 | 3/1994 | European Pat. Off. ............... 324/317 |

OTHER PUBLICATIONS

Synthetic Metals, vol. 52, No. 1, Sep. 15, 1992, pp. 57–69, F. Bensebaa, et al., "The Effect of Oxygen on Phthalocyanine Radicals II. Comparative Study of Two Lithium Phthalocyanine Powder Derivates by Continuous and Pulsed ESR".

Magnetic Resonance in Medicine, vol. 20, No. 2, Aug. 1, 1991, pp. 333–339, H. M. Swartz, et al., "Measurements of Pertinent Concentrations of Oxygen in Vivo".

Sensors and Actuators B, vol. B6, No. 1–3, Jan. 1, 1992, pp. 266–269, D. Duret, et al., "Oxygen Concentration Measurements Using the ESR Line Modification of PcLi Molecules".

*Primary Examiner*—Louis M. Arana
*Attorney, Agent, or Firm*—Oblon, Spivak, McClelland, Maier & Neustadt

[57] ABSTRACT

A probe for detecting and dosing molecular oxygen by the electronic paramagnetic resonance spectrometry of a sample of lithium phthalocyanine in contact with the atmosphere to be tested. The probe includes a fixed glass tube with the shape of a hairpin, traversed by a flow of an atmosphere to be tested. The top of the tube contains a chamber with porous walls traversed by the flow of the atmosphere to be tested. The chamber contains the phthalocyanine sample and is surrounded by the spires of an electronic resonance detector trip coil. A movable magnet surrounds the tube and is provided with windings to create a continuous field for polarizing the phthalocyanine sample.

7 Claims, 2 Drawing Sheets

PROBE FOR DETECTING AND DOSING MOLECULAR OXYGEN BY MEANS OF ELECTRONIC PARAMAGNETIC RESONANCE SPECTROMETRY

FIELD OF THE INVENTION

The present invention concerns detecting and dosing oxygen in an atmosphere to be tested.

BACKGROUND OF THE INVENTION

More particularly, but not exclusively, the invention concerns implementing known methods with the aid of a suitable probe for dosing oxygen by means of electronic paramagnetic resonance spectrometry of the lithium phtalocyanine molecule in its particular quadratic crystalline form. These known methods have been described in the documents FR-A-90 08738 and FR-A-90 08739 dated Jul. 10, 1990.

Mention shall first of all be made briefly to a population of nuclear or electronic spins being placed to be moved in rotation at a frequency $Fo=\delta Bo$ when they are subjected to a high and continuous magnetic induction $Bo$, $\delta$ being the characteristic gyromagnetic ratio of the substance in question. If in addition this polarized substance is subjected to an adjustable radiofrequency magnetic field having a direction perpendicular to the induction Bo, a resonance phenomenon is observed when this adjustable radiofrequency passes through the value Fo. This state of resonance is expressed by an emission or absorption of energy passing through maximums able to be detected.

Now, the molecular configuration of the quadratic crystalline form of the lithium phtalocyanine enables the latter to solely selectively trap the oxygen molecules $O_2$. The trapped molecule $O_2$ creates a magnetic coupling which affects the electric paramagnetic resonance signal of the phtalocyanine and allows for its spectrometric identification and accordingly for detecting the presence and measuring the quantity of oxygen molecules $O_2$ in a gaseous mixture bathing a sample of lithium phtalocyanine. Furthermore, the phtalocyanines used in the invention are radical-like type phtalocyanines, this special characteristic implying that the width of their electronic paramagnetic resonance line varies almost linearly with the oxygen content in a range of oxygen concentrations of between 0 and 10%, which easily allows a quantitative dosing to be made.

The methods for detecting an electronic resonance signal are known to experts in this field and shall therefore not be described further in detail. In the present invention, any known method may be used and in particular the one described in the prior document FR-A-99 09830 dated Jul. 20 1988.

Nevertheless in theory, the passage through the state of magnetic resonance may be provoked, both by scanning the polarization induction Bo and also by varying the frequency of the excitation field. It is the first method which shall be described in the remainder of this text, but it needs to be understood that this is merely a non-restrictive option.

Although the principle of the detection of molecular oxygen by means of electronic paramagnetic resonance by lithium phtalocyanine has been known from the documents FR-A-90 08738 and FR-A-90 08739 dated Jul. 10, 1990, no embodiment of an industrial device has occurred since this date owing to the difficulties for designing an operational probe, especially as regards the introduction of the lithium phtalocyanine into the atmosphere to be tested, this introduction needing to be compatible with the possibility of precisely subjecting it to the magnetic inductions required for the production and detection of the electronic paramagnetic resonance phenomenon. Now, it is well known that the magnets and coils used for these purposes are extremely delicate to embody and are generally extremely expensive.

SUMMARY OF THE INVENTION

The object of the present invention is to provide a probe for detecting and dosing the molecular oxygen by means of electronic resonance spectrometry of the lithium phtalocyanine, thus simply resolving the aforesaid drawbacks whilst being able to be easily applied to industrial applications.

This probe is characterized in that it includes:

at least one fixed glass tube, generally having the shape of a hairpin, traversed by a flow of the atmosphere to be tested, at the top of which a chamber with porous walls traversed by said flow contains the phtalocyanine sample and is surrounded by the spires of coil for exciting and detecting the electronic resonance;

a movable magnet having a field frame with generally an elongated tubular cylindrical shape whose central pipe possesses a shape and dimensions enabling it to be adapted around the preceding tube which it then covers completely, this movable magnet being provided with windings enabling it to create perpendicular to the field of said excitation coil the continuous field $\vec{Bo}$ for polarizing the lithium phtalocyanine and the oscillating field for scanning this polarization Bo so as to find the state of resonance.

According to the preceding definition, the two main characteristics of the probe-of the invention reside firstly in the fact of carrying out a measurement in a flow of the atmosphere to be tested, the lithium phtalocyanine sample being trapped inside this flow in a chamber with porous walls traversed by this same flow, and secondly as regards the movable design of the scanning and polarization magnet which, by virtue of its shape, can be used as a housing for the glass tube. The chamber with porous walls, which formerly was not easy to do, is able to keep in place at a fixed location the phtalocyanine sample whilst enabling the latter to be traversed by the flow of air to be tested. Moreover, the movable nature of the magnet, especially in an industrial installation where it is desired to measure the percentage of oxygen at several locations of a gaseous flow, only uses a single magnet for several glass tubes fixed at various locations of a gaseous path. This results in achieving substantial savings as mentioned earlier since the polarization magnet is a delicate part to produce and thus an extremely expensive one.

According to one particularly advantageous embodiment of the invention, the chamber with porous walls containing the lithium phtalocyanine sample is made of sintered glass.

According to another advantageous embodiment of the invention, the two inlet and outlet branches of the glass tube are connected to a solid stainless steel piece comprising a hollow pipe to allow for the flow of the gas constituting the atmosphere to be tested, and two inlet and outlet tubes, also made of stainless steel, are welded to the two branches of the glass tube. This solid stainless steel piece, used to bring it from the atmosphere to be tested into the glass tube, is also able to be used with the aid of screws and internal screw threads so as to ensure the accurate fixing of the polarization magnet around the tube as the latter is welded permanently to said piece.

Finally, according to another advantageous characteristic of the present invention, the polarization and scanning winding is divided into several sections along the wall of the magnetic frame so that its center of gravity is situated inside the chamber with porous walls and creates a homogeneous field in the entire chamber.

This disposition allows for considerable flexibility in establishing the scanning and polarization magnetic induction, since it is the distribution of the spires of the coil in the various sections of the wall of the magnetic frame which makes it possible at the exact desired location to obtain a homogeneous field concerning a dimension equal at least to that of the chamber with porous walls containing the phtalocyanine. The shapes and dimensions of these coils may be deduced from the article by L. B. Lugansky entitled "On Optical Synthesis of Magnetic Fields" in Journal of Physics, 1, 53 (1990).

BRIEF DESCRIPTION OF THE DRAWINGS

The present invention shall be more readily understood from a reading of the following non-restrictive example of a description of the probe of the invention given solely by way of illustration with reference to the accompanying figures on which.

DETAILED DESCRIPTION OF THE PREFERRED EMBODIMENTS

Figure 1:
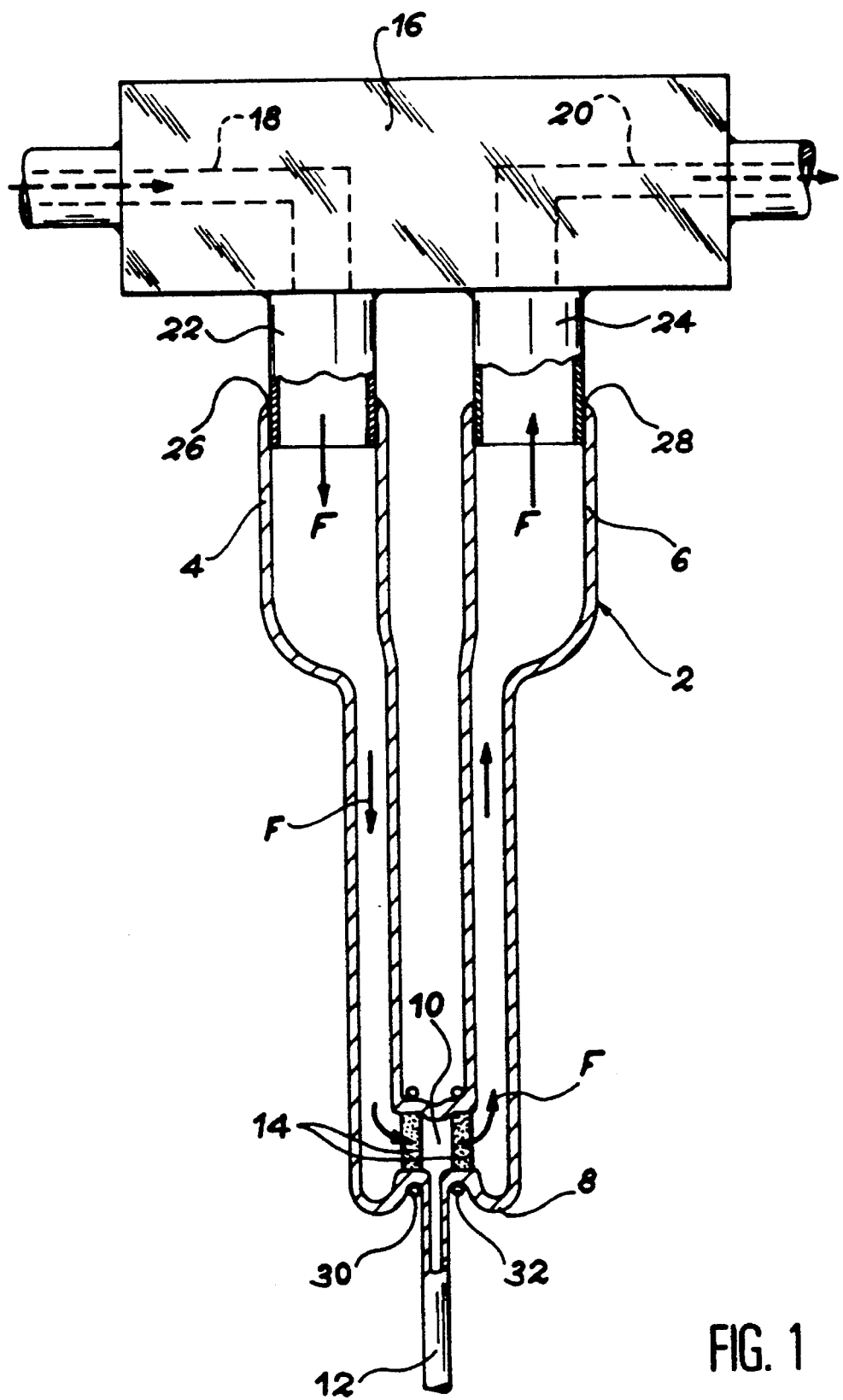
FIG. 1 shows the glass tube secured to its solid stainless steel piece.

FIG. 1 shows the glass tube 2 whose general shape is that of a hairpin with one inlet branch 4, one outlet branch 6 and a top 8 where the chamber with porous walls 10 is clearly located. Shown at the lower portion of FIG. 1 is a pip 12 which is used to introduce the lithium phtalocyanine into the chamber 10, after which it it closed permanently.

The atmosphere it is desired to test in the glass tube 2 circulates along the direction of the arrows F by traversing the sintered glass walls 14 of the chamber with porous walls. Shown at the upper portion of FIG. 1 is the solid stainless steel piece 16 which is used as a support for the glass tube 4 and, as can be seen on the following FIG. 2, for supporting the polarization magnet. This solid stainless steel piece comprises a hollow pipe 18 for admitting the atmosphere to be tested into the tube 2, as well as a hollow pipe 22 for the outward emission of the flow of said atmosphere. Two tubes, one inlet tube 22 and one outlet tube 24, also form part of the solid piece 16 and are also made of stainless steel. The connection of the tube 2 to these tubes 22 and 24 is effected by welds given on the drawing the references 26 and 28.

Finally, the coil used for exciting the lithium phtalocyanine and detecting the electronic paramagnetic resonance line is formed of two spires surrounding the chamber with porous walls 10 and visible on the figure at 30 and 32. Once this coil is fixed to the top of the glass tube immediately close to the chamber with porous walls 10, it is a simple matter to excite the lithium phtalocyanine which, for reasons of more clarity, has not been shown in the chamber 10 on FIG. 1. The use of a single coil for excitation and detection has already been described by A. Abragam in "The Principles of Nuclear Magnetism", pages 78 to 80.

Figure 2:
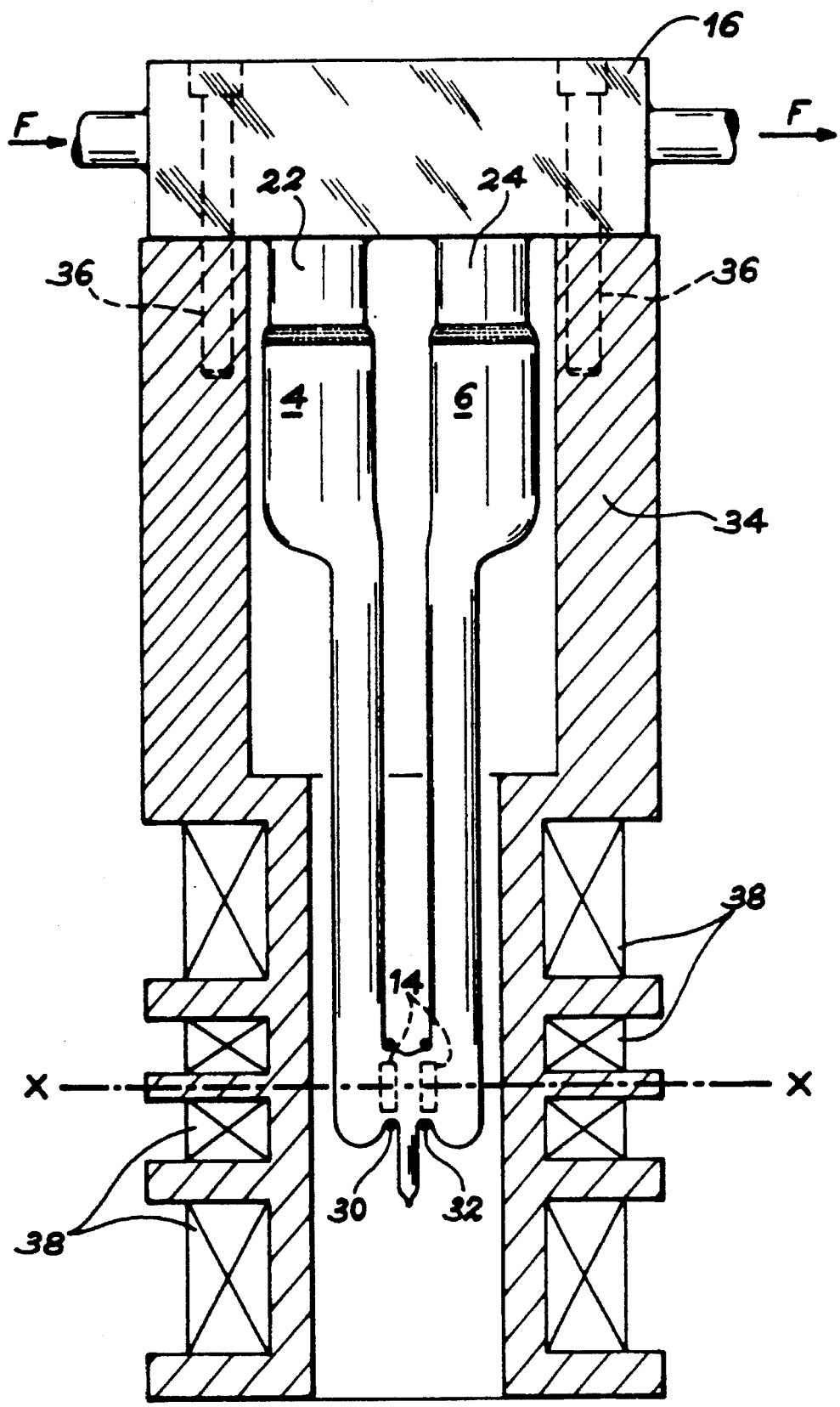
FIG. 2 shows the same piece but on this occasion covered with the polarization magnet fixed at its upper portion to the solid stainless steel piece.

FIG. 2 shows all the elements of FIG. 1 bearing the same reference numbers. However, this FIG. 2 corresponds to the situation in which the scanning and polarization magnet 34 is fixed around the glass tube 2 where it is encompassed like a cover. This magnet 34 is fixed to the solid stainless steel piece 16 by a screw and internal screw thread system 36, and at the lower portion of the drawing of FIG. 2, divided into four sections are the scanning and polarization coils 38 for the polarization induction Bo required for triggering the electronic paramagnetic resonance and polarization phenomenon of the lithium phtalocyanine crystals situated at the top of the glass tube 2. This winding 38 is effected split up symmetrically into four sections with respect to the plane XX of FIG. 2 so as to create, as indicated earlier, a magnetic induction as homogeneous as possible in the entire volume of the chamber with porous walls 10.

One of the major advantages of the probe of the present invention resides in the fact that, as the scanning and polarization magnet 34 is easily able to be separated from the solid stainless steel piece 16, it is possible to have in an industrial installation several glass tubes comparable to those of FIG. 1 situated at different locations but still able to be used for detection measurements and the dosing of oxygen via the mere fact that they can be adapted to a single polarization magnet 34.

What is claimed is:

1. A probe for detecting the concentration of molecular oxygen in an atmosphere comprising:

a) at least one glass tube having a top, an inlet branch, and an outlet branch, said tube having the general shape of a hairpin, the top of said tube having a chamber with porous walls, said chamber containing a lithium phthalocyanine sample;

b) excitation coil means for providing an excitation magnetic field in said chamber and for detecting an electronic paramagnetic resonance signal from said lithium phthalocyanine; and c) a movable magnet for generating a magnetic field $B_o$ in said chamber for polarizing the lithium phthalocyanine.

2. The probe according to claim 1, wherein (i) said excitation coil means comprises a coil surrounding said chamber;

(ii) said movable magnet has a generally elongated cylindrical tubular shape; and (iii) said probe further comprises a means for attaching said movable magnet to said tube.

3. The probe according to claim 1, wherein said movable magnet completely surrounds said tube when said means for attaching said movable magnet to said tube attaches said movable magnet to said tube.

4. Probe according to claim 1, wherein the chamber with porous walls containing the lithium phtalocyanine sample is made of sintered glass.

5. A probe according to claim 1, wherein said movable magnet comprises scanning and polarization windings that are divided into several sections along a wall of the movable magnet so that a center of gravity of the scanning and polarization windings is situated inside the chamber with porous walls and creates a homogenous field in the chamber.

6. Probe according to claim 1 or 4, wherein the scanning and polarization winding is divided into several sections along the wall of the magnetic frame so that its center of gravity is situated inside the chamber with porous walls and creates a homogeneous field in the entire chamber.

7. The probe according to claim 1 or 4, further comprising a stainless steel piece having an inlet, an outlet, and a chamber, said steel piece inlet and outlet being fixedly attached to said tube inlet branch and outlet branch, respectively, so that said atmosphere can flow continuously from said steel piece through said tube and back to said steel piece.

\* \* \* \* \*